(12) United States Patent
Kim et al.

(10) Patent No.: US 9,391,274 B2
(45) Date of Patent: Jul. 12, 2016

(54) NONVOLATILE MEMORY ELEMENT AND METHOD OF MANUFACTURING THE SAME

(71) Applicant: CANON ANELVA CORPORATION, Kawasaki-shi (JP)

(72) Inventors: Eun-mi Kim, Kawasaki (JP); Yuichi Otani, Kawasaki (JP); Takashi Nakagawa, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 0 days.

(21) Appl. No.: 14/829,897

(22) Filed: Aug. 19, 2015

(65) Prior Publication Data

US 2016/0079530 A1 Mar. 17, 2016

Related U.S. Application Data

(63) Continuation of application No. 13/906,609, filed on May 31, 2013, now abandoned, which is a continuation of application No. PCT/JP2011/006597, filed on Nov. 28, 2011.

(30) Foreign Application Priority Data

Dec. 1, 2010 (JP) ................................. 2010-268517

(51) Int. Cl.
*H01L 21/00* (2006.01)
*H01L 21/16* (2006.01)
(Continued)

(52) U.S. Cl.
CPC ........ *H01L 45/1625* (2013.01); *C23C 14/0042* (2013.01); *C23C 14/0641* (2013.01);
(Continued)

(58) Field of Classification Search
CPC ... H01L 45/145; H01L 45/146; H01L 45/147; H01L 27/2409
See application file for complete search history.

(56) References Cited

U.S. PATENT DOCUMENTS 5,874,364 A 2/1999 Nakabayashi et al.
6,271,077 B1 8/2001 Nakabayashi et al.
(Continued)

FOREIGN PATENT DOCUMENTS

JP 08-250683 A 9/1996
JP 09-092795 A 4/1997
(Continued)

OTHER PUBLICATIONS

International Search Report in PCT/JP2011/006597, issued Feb. 21, 2010 (7 pages).
(Continued)

*Primary Examiner* — Zandra Smith
*Assistant Examiner* — John M Parker
(74) *Attorney, Agent, or Firm* — Fitzpatrick, Cella, Harper & Scinto

(57) ABSTRACT

The present invention provides a nonvolatile memory element, in a nonvolatile memory element having a variable resistance layer possessing a stacked structure, in which the variable resistance layer has a high resistance change ratio, and a method of manufacturing the same. The nonvolatile memory element according to one embodiment of the present invention includes a first electrode, a second electrode, and a variable resistance layer which is interposed between the first electrode and second electrode and in which the resistance value changes into at least two different resistance states. The variable resistance layer possesses a stacked structure having a first metal oxide layer containing Hf and O, and a second metal oxide layer that is provided between the first metal oxide layer and at least one of the first electrode and the second electrode and contains Al and O.

4 Claims, 11 Drawing Sheets

(51) Int. Cl.
*H01L 45/00* (2006.01)
*G11C 13/00* (2006.01)
*C23C 14/00* (2006.01)
*C23C 14/06* (2006.01)
*C23C 14/08* (2006.01)
*C23C 14/35* (2006.01)
*C23C 14/50* (2006.01)

(52) U.S. Cl.
CPC ............ *C23C14/081* (2013.01); *C23C 14/083* (2013.01); *C23C 14/35* (2013.01); *G11C 13/0007* (2013.01); *H01L 45/04* (2013.01); *H01L 45/1233* (2013.01); *H01L 45/1253* (2013.01); *H01L 45/146* (2013.01); *H01L 45/16* (2013.01); *C23C 14/505* (2013.01); *G11C 2213/15* (2013.01); *G11C 2213/55* (2013.01)

(56) References Cited

U.S. PATENT DOCUMENTS

| | | | |
|---|---|---|---|
| 6,303,391 | B1 | 10/2001 | Hintermaier et al. |
| 6,515,843 | B2 | 2/2003 | Nakabayashi et al. |
| 7,400,027 | B2 | 7/2008 | Joung et al. |
| 7,867,847 | B2 | 1/2011 | Kitano et al. |
| 8,116,116 | B2 | 2/2012 | Hwang et al. |
| 8,178,934 | B2 | 5/2012 | Kitano et al. |
| 8,264,865 | B2 | 9/2012 | Mitani et al. |
| 8,395,138 | B2 | 3/2013 | Yamamoto et al. |
| 8,415,753 | B2 | 4/2013 | Nakagawa et al. |
| 2006/0131554 | A1 | 6/2006 | Joung et al. |
| 2009/0102597 | A1* | 4/2009 | Ishihara ............ G11C 13/0007 338/20 |
| 2009/0225583 | A1* | 9/2009 | Lee .................... G11C 13/0007 365/148 |
| 2010/0002491 | A1 | 1/2010 | Hwang et al. |
| 2010/0038615 | A1 | 2/2010 | Nakagawa |
| 2010/0181546 | A1 | 7/2010 | Yamamoto et al. |
| 2010/0221885 | A1 | 9/2010 | Kitano et al. |
| 2011/0002154 | A1 | 1/2011 | Mitani et al. |
| 2011/0064642 | A1 | 3/2011 | Kitano et al. |
| 2012/0091426 | A1 | 4/2012 | Tada et al. |
| 2013/0037775 | A1 | 2/2013 | Mitani et al. |

FOREIGN PATENT DOCUMENTS

| | | |
|---|---|---|
| JP | 2006-179926 A | 7/2006 |
| JP | 2007-214377 A | 8/2007 |
| JP | 2007-214600 A | 8/2007 |
| JP | 2008-244018 A | 10/2008 |
| JP | 2009-135370 A | 6/2009 |
| JP | 2009-212380 A | 9/2009 |
| JP | 2010-016381 A | 1/2010 |
| JP | 4469023 B2 | 5/2010 |
| JP | 4494525 B1 | 6/2010 |
| JP | 2010-165950 A | 7/2010 |
| KR | 10-2010-0085989 A | 7/2010 |
| WO | 2008/062623 A1 | 5/2008 |
| WO | 2010/125810 A1 | 11/2010 |
| WO | 2010/150723 A1 | 12/2010 |

OTHER PUBLICATIONS

International Preliminary Report on Patentability in PCT/JP2011/006597, issued Jun. 13, 2013 (16 pages).

Seo et al. (2005), "Conductivity Switching Characteristics and Reset Currents in NiO Films," Appl. Phys. Lett. 86:093509 (3 pages).

Wei et al. (2008), "Highly Reliable TaOx ReRAM and Direct Evidence of Redox Reaction Mechanism," IEEE Technical Digest (Devices Meeting), pp. 293-296.

Gao et al. (2009), "Oxide-Based RRAM: Uniformity Improvement Using a New Material-Oriented Methodology," Symposium on VLSI Technology Digest of Technical Papers, pp. 30-31.

Lee et al. (2008), "Low Power and High Speed Bipolar Switching with A Thin Reactive Ti Buffer Layer in Robust HfO2 Based RRAM," IEEE Technical Digest (Devices Meeting), pp. 297-300.

Office Action issued in Korean Patent Application No. 10-2013-7016723, dated May 31, 2014 (4 pages).

Office Action issued in Taiwanese Patent Application No. 100144215, dated Oct. 6, 2014 (7 pages).

* cited by examiner

O/Al: 1.0

O/Al: 1.5

O/Al:2.2

REGION OF N/Ti RATIO AND FILM DENSITY IN WHICH
RESISTANCE CHANGE OPERATION IS OBTAINED

REGION OF N/Ti RATIO AND PEAK INTENSITY RATIO IN WHICH RESISTANCE CHANGE OPERATION IS OBTAINED

CONDITION B
CONDITION A
CONDITION C

C(200)/C(111)
N/Ti

CONDITION A

TITANIUM NITRIDE FILM

NONVOLATILE MEMORY ELEMENT AND METHOD OF MANUFACTURING THE SAME

CROSS-REFERENCE TO RELATED APPLICATIONS

This application is a divisional application of U.S. patent application Ser. No. 13/906,609, filed May 31, 2013, which is a continuation application of International Application No. PCT/JP2011/006597, filed Nov. 28, 2011, which claims the benefit of Japanese Patent Application No. 2010-268517, filed Dec. 1, 2010. The contents of the aforementioned applications are incorporated herein by reference in their entireties.

TECHNICAL FIELD

The present invention relates to a nonvolatile memory element and a method of manufacturing the same, and in particular, is a technology relating to a resistance change type nonvolatile memory element and a method of manufacturing the same.

BACKGROUND ART

For a flash memory using a floating gate, which is the mainstream currently, there is such a problem that, along with the miniaturization of a memory cell, a threshold voltage (Vth) variation occurs caused by the interference due to capacitive coupling between floating gates of neighboring cells.

Accordingly, as a memory of a configuration appropriate to the miniaturization, the development of a resistance change type nonvolatile memory element having a layer in which resistance changes interposed between electrodes, is advanced. The resistance change type nonvolatile memory element is characterized in that the electric resistance of a resistive layer can be switched between two or more values by electric stimulus. The element is expected, because of the simplicity on the element structure and operation, as a nonvolatile memory element that allows the miniaturization and cost reduction.

Layers in which the resistance changes by an applied voltage include a layer of an oxide of an element selected from the group consisting of transition metals. As the oxides, there are nickel oxide (NiO), vanadium oxide ($V_2O_5$), zinc oxide (ZnO), niobium oxide ($Nb_2O_5$), titanium oxide ($TiO_2$), tungsten oxide ($WO_3$), titanium oxide ($TiO_2$), cobalt oxide (CoO), tantalum oxide ($Ta_2O_5$) etc.

Although details of the operation principle of resistance change are not clear, a principle that, by application of a voltage to a resistance change layer, a current path referred to as a filament is formed in the resistance change layer and the resistance of the element changes according to the connection state between the filament and the upper and lower electrodes, and a principle that the resistance of the resistance change layer changes due to the movement of oxygen atoms at the boundary of the electrode and the resistance change layer, are reported.

By use of FIG. 16, an example of the operation principle of a resistance change type nonvolatile memory element (ReRAM: Resistive Random Access Memory) is described. A resistance change type nonvolatile memory element (a memory element) 610 being a general ReRAM has a parallel plate type stacked structure, in which a resistance change film (for example, a transition metal oxide film) 613 is interposed between a lower electrode 612 and an upper electrode 614 formed on an interlayer insulating film 611. A reference numeral 618 is a contact hole for connection with an external wiring. When a voltage is applied between the upper electrode 614 and the lower electrode 612, the electric resistance of the resistance change film 613 changes and can take two different resistance states (a reset state, a set state).

Regarding the operation mechanism of the resistance change type nonvolatile memory element 610, first, as an initial operation for allowing transition between two resistance states, a forming voltage is applied. The application of the forming voltage sets a state that a filament to be a current path may be formed in the resistance change film 613. After that, the application of an operation voltage (a set voltage or a reset voltage) changes the generation state of the filament to perform a set/reset operation, that is, writing or deletion.

In Patent Literature 1, a nonvolatile memory element is proposed in which an amorphous insulating layer containing a nickel oxide and a crystalline resistance change layer containing a nickel oxide are stacked between upper and lower electrodes, and it is described that insulation breakdown of the amorphous insulating film occurs and a stable filament is formed in the resistance change layer on a region through which a current flowed.

In Patent Literature 2, a nonvolatile memory element is proposed in which a hafnium oxide film having a composition of HfOx ($0.9 \leq x \leq 1.6$) and a hafnium oxide film having a composition of HfOy ($1.8 < y < 2.0$) are stacked between upper and lower electrodes and which has a high-speed and reversibly stable rewriting property.

In Non Patent Literature 1, a nonvolatile memory element is proposed in which Pt is used as upper and lower electrodes and the resistance change layer contains NiO, and it is described that a current path referred to as a filament is formed in a Ni oxide and the resistance changes. In addition, in Non Patent Literature 2, a nonvolatile memory element is proposed in which Pt is used as upper and lower electrodes and the resistance change layer contains TaOx, and it is described that the resistance changes by the movement of oxygen atoms at the boundary layer between the Pt electrode and TaOx.

In addition, a technology regarding a resistance change type nonvolatile memory element by use of a titanium nitride electrode as an electrode material for which etching processing is easy attracts attention. In Non Patent Literature 3, a nonvolatile memory element is proposed in which Pt is used as a lower electrode, HfOx or HfAlOx is used as a resistance change layer and an upper electrode contains TiN, and it is described that, by use of HfAlOx as a resistance change layer, the variation of operation voltage can be suppressed. In addition, in Non Patent Literature 4, it is described that it is possible to realize a resistance change operation by fabricating a stacked structure having TiN/TiOx/HfOx/TiN by oxygen annealing of a TiN/Ti/HfO$_2$/TiN stacked structure.

CITATION LIST

Patent Literature

PTL 1: International Patent Publication Pamphlet No. 2008/062623
PTL 2: Japanese Patent No. 04469023

Non Patent Literature

NPL 1: APPLIED PHYSICS LETTERS 86, 093509 (2005)

NPL 2: International electron devices meeting technical digest, 2008, P 293

NPL 3: Symposium on VLSI technology digest of technical papers, 2009. p 30

NPL 4: International electron devices meeting technical digest, 2008, P 297

SUMMARY OF INVENTION

However, in the above described technologies, there are such problems, respectively, as described below.

First, the technology using the stacked structure in which an amorphous insulating layer and a crystalline resistance change layer are stacked as in Patent Literature 1 is effective for suppressing variation of operation voltage of the element, and for stably storing information, but, since the composition of the resistance change layer is not specifically described, there is such a problem that a resistance change ratio can not be improved.

Secondly, as in Patent Literature 2, two layers of an HfOx film and an HfOy film different in compositions are used as a variable resistance layer in order to obtain stable rewriting resistance change characteristics, but, there is such a problem that the change ratio between a high resistance state and a low resistance state is 5 to 8, which is low.

Thirdly, in order to obtain good resistance change characteristics by use of NiOx or TaOx as a variable resistance layer as in Non Patent Literature 1 and Non Patent Literature 2, as upper and lower electrodes, it is necessary to use Pt. The technology of using a Pt electrode as an electrode of a resistance change type nonvolatile memory element is effective for suppressing operation instability of element characteristics caused by the oxidation of electrode, but there are such problems that etching in an electrode processing process is difficult and reduction in material cost is difficult.

Fourthly, the technology of using a metal oxide containing Hf and Al as a resistance change layer and using TiN as an electrode material as in Non Patent Literature 3 and Non Patent Literature 4 is effective for reducing material cost in the etching in the above-mentioned electrode processing process, but there is such a problem that nothing is described about the range of oxygen composition in the metal oxide film optimum for obtaining resistance change characteristics.

The present invention was achieved for the above-described conventional problems, and has an object of providing, in a nonvolatile memory element having a variable resistance layer of a stacked structure, a nonvolatile memory element in which the variable resistance layer has a high resistance change ratio and a method of manufacturing the same.

In order to achieve above-described object, a first aspect of the present invention is a nonvolatile memory element including a first electrode, a second electrode, and a variable resistance layer which is interposed between the first electrode and the second electrode and in which a resistance value thereof changes into at least to different resistance states, wherein the variable resistance layer possesses a stacked structure having a first metal oxide layer containing Hf and O and a second metal oxide layer that is provided between the first metal oxide layer and at least one of the first electrode and the second electrode and contains Al and O.

In addition, a second aspect of the present invention is a method of manufacturing a nonvolatile memory element including a first electrode, a second electrode, and a variable resistance layer which is interposed between the first electrode and the second electrode and in which a resistance value thereof changes into at least two different resistance states, wherein the variable resistance layer possesses a stacked structure having a first metal oxide layer containing Hf and O, and a second metal oxide layer that is provided between the first metal oxide layer and at least one of the first electrode and the second electrode and contains Al and O; wherein a step of forming the variable resistance layer includes, forming the first metal oxide layer; and forming the second metal oxide layer, wherein the forming the first metal oxide layer includes a first magnetron sputtering step, under a mixed atmosphere of a reactive gas containing oxygen and an inert gas, of using hafnium as a metal target and setting a mixing ratio of the reactive gas and the inert gas so that a molar ratio of Hf and O (an O/Hf ratio) satisfies a range of 0.30 to 1.90; and wherein the forming the second metal oxide layer includes a second magnetron sputtering step, under a mixed atmosphere of a reactive gas containing oxygen and an inert gas, of using aluminum as a metal target and setting a mixing ratio of the reactive gas and the inert gas so that a molar ratio of Al and O (an O/Al ratio) satisfies a range of 1.0 to 2.2.

According to the present invention, it is possible to realize a resistance change type nonvolatile semiconductor element having a high resistance change ratio.

DESCRIPTION OF EMBODIMENTS

Hereinafter, the embodiment of the present invention is described in detail on the basis of drawings.

The present invention is directed to a resistance change type nonvolatile semiconductor element (a resistance change type nonvolatile memory element etc.) that has a variable resistance layer having a stacked structure of a first metal oxide film containing Hf and O and a second metal oxide layer containing Al and O, and an electrode including a metal nitride layer containing Ti and N as a first and a second electrode. The present inventors studied hard on metal oxide film structures suitable for resistance change in these resistance change type nonvolatile semiconductor elements, and, as the result, discovered that it is possible to realize a resistance change type nonvolatile semiconductor element (a nonvolatile memory element) having a high resistance change ratio, by setting the molar ratio of Hf and O (an O/Hf ratio) of the first metal oxide layer containing Hf and O to be in the composition range represented by 0.30 to 1.90, and setting the molar ratio of Al and O (an O/Al ratio) of the second metal oxide layer containing Al and O to be in the composition range represented by 1.0 to 2.2.

In addition, the present inventors discovered that it is possible to realize a resistance change type nonvolatile semiconductor element (a nonvolatile memory element) having a high resistance change ratio, in a method of manufacturing a nonvolatile memory element including a variable resistance layer, in which a resistance value changes into at least two different states, interposed between a first electrode and a second electrode, by forming a first metal oxide layer containing Hf and O by performing a first magnetron sputtering process while using hafnium as a metal target under a mixed atmosphere of a reactive gas containing oxygen and an inert gas and setting the mixing ratio of the reactive gas and the inert gas so that the molar ratio of Hf and O (an O/Hf ratio) satisfies the range of 0.30 to 1.90 in a vacuum vessel, and by forming a variable resistance layer by forming a second metal oxide layer containing Al and O by performing a second magnetron sputtering process while using aluminum as a metal target under a mixed atmosphere of a reactive gas containing oxygen and an inert gas and setting the mixing ratio of the reactive gas and the inert gas so that the molar ratio of Al and O (an O/Al ratio) satisfies the range of 1.0 to 2.2 in a vacuum vessel.

Figure 1:
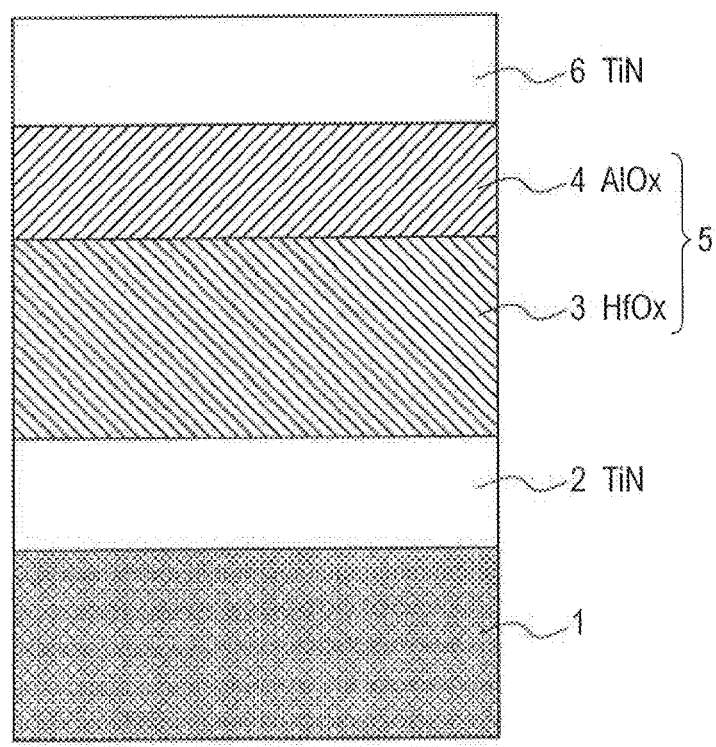
FIG. 1 is a drawing showing a cross-section of an element structure according to one embodiment of the present invention.

The form of variable resistance layer and the titanium nitride electrode layer suitable for the resistance change type nonvolatile memory element in one embodiment of the present invention is described with the resistance change type nonvolatile memory element in FIG. 1 taken as an example. As shown in FIG. 1, on a foundation substrate having a silicon oxide film on the surface (for example, a Si substrate on which a thermally-oxidized film is formed) 1, there are formed a titanium nitride film 2 being a first electrode, a variable resistance layer 5 being a stacked body of a first metal oxide film (HfOx) 3 containing Hf and O and a second metal oxide film (AlOx) 4 containing Al and O on the titanium nitride film 2, and a titanium nitride film 6 being a second electrode on the variable resistance layer 5.

Figure 2:
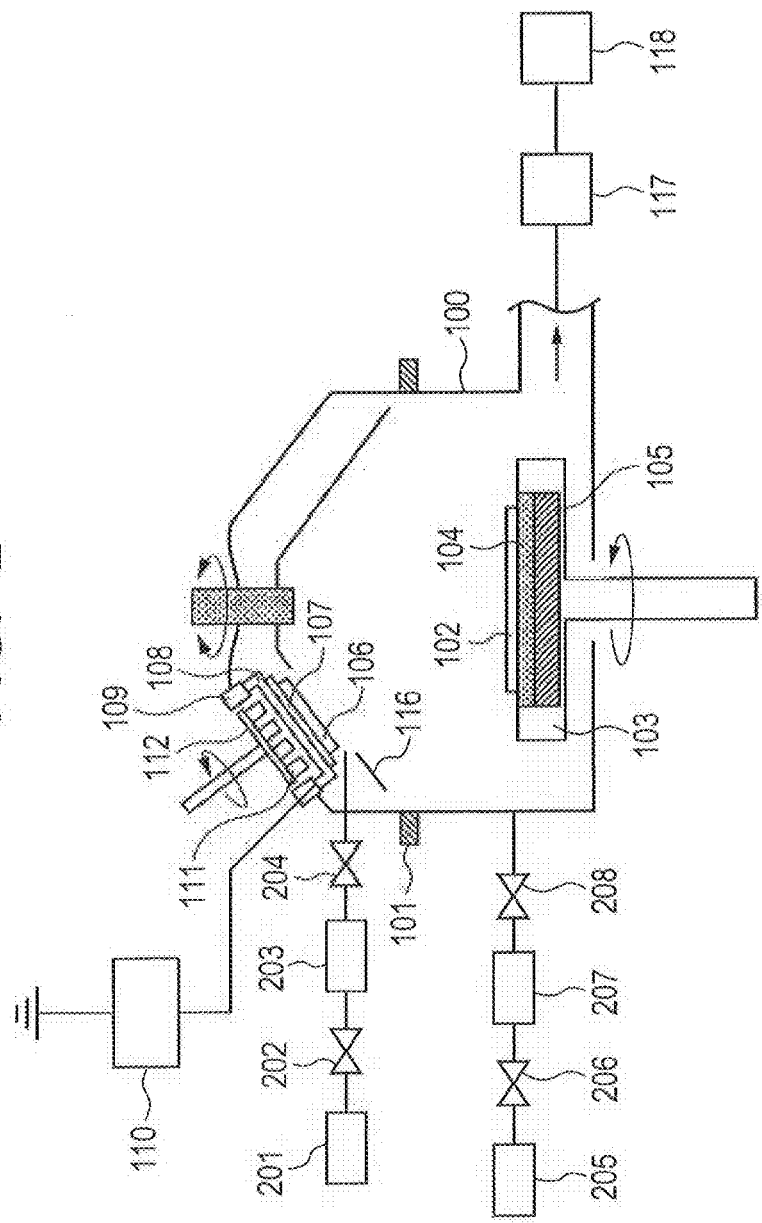
FIG. 2 is a drawing showing an outline of a processing apparatus for use in a formation process of a titanium nitride film according to one embodiment of the present invention.

FIG. 2 shows an outline of a processing apparatus for use in a formation process of a titanium nitride film configuring the first electrode and a variable resistance film (a variable resistance layer 5) having a stacked structure in one embodiment of the present invention.

A deposition processing chamber 100 is configured so as to be heated to a prescribed temperature by a heater 101. A substrate to be processed 102 can be heated to a prescribed temperature by a heater 105 through a susceptor 104 built in a substrate support 103. It is preferable that the substrate support 103 can rotate at a prescribed rotation number from the viewpoint of the uniformity of the film thickness. In the deposition processing chamber, a target 106 is placed in a position facing the substrate to be processed 102. The target 106 is placed over a target holder 108 through a back plate 107 made of a metal such as copper. Meanwhile, it is also allowable to fabricate an outer shape of a target assembly combining the target 106 and the back plate 107 with the target material as one component and to mount the same as a target. That is, the configuration in which the target is placed on the target holder is allowable. To the target holder 108 made of a metal such as Cu, a direct-current power source 110 applying electric power for sputtering discharge is connected, and the holder is insulated from the wall of the deposition processing chamber 100 at the ground potential by an insulator 109. On the rear of the target 106 seen from the sputtering face, a magnet 111 for realizing magnetron sputtering is disposed. The magnet 111 is held by a magnet holder 112, and is rotatable by a magnet holder rotation mechanism not shown. In order to make erosion of the target uniform, the magnet 111 rotates during the discharge. The target 106 is placed in an obliquely upper offset position relative to the substrate 102. That is, the center point of the sputtering face of the target 106 lies at a position shifted by a prescribed dimension relative to the normal line of the center point of the substrate 102. Between the target 106 and the substrate to be processed 102, a shielding plate 116 is disposed, which controls the film formation on the processing substrate 102 by sputtering particles emitted from the target 106 to which electric power is supplied.

For the formation of the first metal oxide film containing Hf and O, it is sufficient to use a metal target of Hf as the target 106. The deposition of the first metal oxide film containing Hf and O is performed by supplying electric power to the metal target 106 from the direct-current power source 110 through each of the target holder 108 and the back plate 107. On this occasion, an inert gas is introduced into the processing chamber 100 from an inert gas source 201 through a valve 202, a mass flow controller 203 and a valve 204 and from the vicinity of the target. In addition, a reactive gas containing oxygen is introduced to the vicinity of the substrate in the processing chamber 100 from an oxygen gas source 205 through a valve 206, a mass flow controller 207 and a valve 208. The introduced inert gas and reactive gas are exhausted by a vacuum pump 118 through a conductance valve 117.

For the deposition of the first metal oxide film containing Hf and O in one embodiment of the present invention, argon is used as a sputtering gas, and oxygen as a reactive gas. It is possible to determine appropriately in the range of 27 to 600° C. for substrate temperature, 50 W to 1000 W for target power, 0.2 Pa to 1.0 Pa for sputtering gas pressure, 0 sccm to 100 sccm for an Ar flow rate, and 0 sccm to 100 sccm for an oxygen gas flow rate. Here, the deposition is performed with the substrate temperature set at 30° C., the target power of Hf at 600 W (100 kHz, 1 us), sputtering gas pressure at 0.24 Pa and the argon gas flow rate at 20 sccm, and with the oxygen gas flow rate changed in the range of 0 sccm to 30 sccm. The molar ratio of the Hf element and the O element in the metal oxide film is adjusted by the mixing ratio of argon and oxygen introduced in the sputtering. Meanwhile, sccm=$cm^3$ number representing a gas flow rate supplied per one minute at 0° C. 1 atmospheric pressure=$1.69 \times 10^{-3}$ Pa·$m^3$/s (at 0° C.). In addition, the reason why the oxygen gas supply rate is set to be 30 sccm or less is to make the decreasing rate of the sputtering rate caused by the oxidation of the surface of the hafnium metal target become the maximum. "The sputtering rate" denotes the proportion of the number of sputtered atoms emitted per one impact ion impacting a sputtering target.

For the formation of the second metal oxide film containing Al and O, it is sufficient to use a metal target of Al as the target 106. The deposition of the second metal oxide film containing Al and O is performed by supplying electric power to the metal target 106 from the direct-current power source 110 through each of the target holder 108 and the back plate 107. On this occasion, an inert gas is introduced into the processing chamber 100 from the inert gas source 201 through the valve 202, the mass flow controller 203 and the valve 204 and from the vicinity of the target. In addition, the reactive gas containing oxygen is introduced to the vicinity of the substrate in the processing chamber 100 from the oxygen gas source 205 through the valve 206, the mass flow controller 207 and the valve 208. The introduced inert gas and the reactive gas are exhausted by the vacuum pump 118 through the conductance valve 117.

For the deposition of the second metal oxide film containing Al and O in one embodiment of the present invention, argon is used as a sputtering gas, and oxygen as a reactive gas. It is possible to determine appropriately in the range of 27 to 600° C. for the substrate temperature, 50 W to 1000 W for the target power, 0.2 Pa to 1.0 Pa for the sputtering gas pressure, 0 sccm to 100 sccm for the Ar flow rate, and 0 sccm to 100 sccm for the oxygen gas flow rate. Here, the deposition is performed with the substrate temperature set at 30° C., the target power of Al at 200 W (100 kHz, 1 us), the sputtering gas pressure at 0.24 Pa and the argon gas flow rate at 20 sccm, and with the oxygen gas flow rate changed in the range of 0 sccm to 40 sccm. The molar ratio of Al element and O element in the metal oxide film is adjusted by the mixing ratio of argon and oxygen introduced in the sputtering. Meanwhile, "the molar ratio" in the description denotes the ratio of molar numbers that are basic units of the amount of a substance. It is possible to measure the molar ratio, for example, from the bonding energy of intrinsic electrons lying in a substance and the energy level and amount of electrons by X-ray photoelectron spectroscopy. Meanwhile, the reason why the oxygen gas supply rate is set to be 40 sccm or less is to make the decreasing rate of the sputtering rate caused by the oxidation of the surface of the aluminum metal target become the maximum.

For the formation of the first electrode and the second electrode consisting essentially of a titanium nitride film, it is sufficient to use a metal target of Ti as the target 106. It is performed by supplying electric power to the metal target 106 from the direct-current power source 110 through each of the target holder 108 and the back plate 107. On this occasion, an inert gas is introduced into the processing chamber 100 from the inert gas source 201 through the valve 202, the mass flow controller 203 and the valve 204 and from the vicinity of the target. In addition, the reactive gas containing nitrogen is introduced to the vicinity of the substrate in the processing chamber 100 from a nitrogen gas source 205 through the valve 206, the mass flow controller 207 and the valve 208. The introduced inert gas and reactive gas are exhausted by a vacuum pump 118 through the conductance valve 117.

The deposition of the titanium nitride film in one embodiment of the present invention uses argon as a sputtering gas and nitrogen as a reactive gas. It is possible to determine appropriately in the range of 27° C. to 600° C., for the substrate temperature, 50 W to 1000 W for the target power, 0.2 Pa to 1.0 Pa for the sputtering gas pressure, 0 sccm to 100 sccm for the Ar flow rate, and 0 sccm to 100 sccm for the nitrogen gas flow rate. Here, the deposition is performed under the substrate temperature of 30° C., the Ti target power of 1000 W, the argon gas flow rate of 0 sccm, and the nitrogen gas flow rate of 50 sccm. The molar ratio of Ti element and N element in the titanium nitride film is adjusted by the mixing ratio of argon and nitrogen introduced in the sputtering.

Next, a method of forming the resistance change type nonvolatile memory element shown in FIG. 1 is described.

First, by use of a deposition apparatus shown in FIG. 2, the first electrode 2 consisting essentially of a titanium nitride film is formed on the Si substrate 1 with a thermally-oxidized film.

Next, by a deposition apparatus similar to the deposition apparatus shown in FIG. 2, on the first electrode 2, a first metal oxide film 3 that contains Hf and O and is included in the variable resistance layer 5 is formed.

Next, by a deposition apparatus similar to the deposition apparatus shown in FIG. 2, on the first metal oxide film 3, a second metal oxide film 4 that contains Al and O and is included in the variable resistance layer 5 is formed. Consequently, the variable resistance layer 5 that is a stacked body of the first metal oxide film 3 and the second metal oxide film is formed.

Next, by a deposition apparatus similar to the deposition apparatus shown in FIG. 2, on the second metal oxide film 4 (that is, on the variable resistance layer 5), as a second electrode 6, a titanium nitride film is deposited in the same manner as the formation process of the first electrode 2.

Next, by use of a lithographic technology and an RIE (Reactive Ion Etching) technology, the TiN film is processed into a desired size to form an element.

The compositions of the deposited first metal oxide film 3 containing Hf and O and the second metal oxide film containing Al and O were analyzed by an x-ray photoelectron spectroscopy (XPS) method. In addition, the resistance change characteristic of the fabricated element was evaluated by an I-V measurement.

<Composition of O/Hf and Resistance Change Characteristic>

Figure 3:
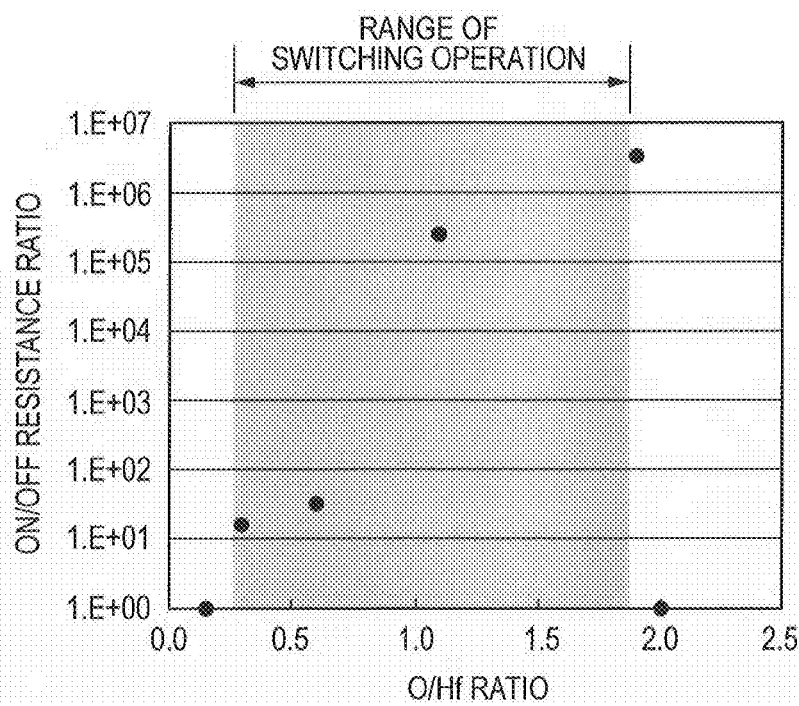
FIG. 3 is a drawing showing a current-voltage characteristic of a resistance change type nonvolatile memory element due to a composition of Hf and O of a stacked type resistance change layer according to one embodiment of the present invention.
Figure 4A:
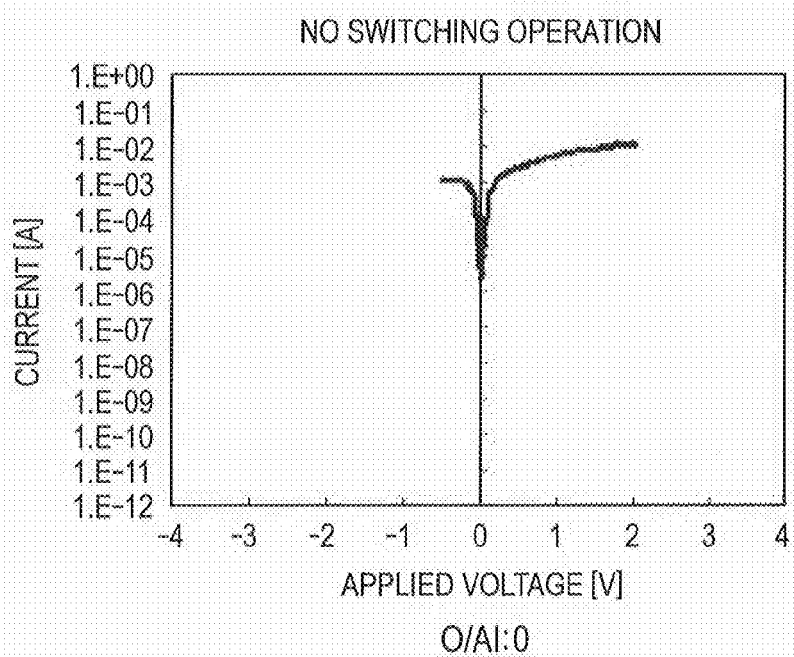
FIG. 4A is a drawing showing a current-voltage characteristic of a resistance change type nonvolatile memory element due to a composition of Al and O of the stacked type resistance change layer according to one embodiment of the present invention.
Figure 4B:
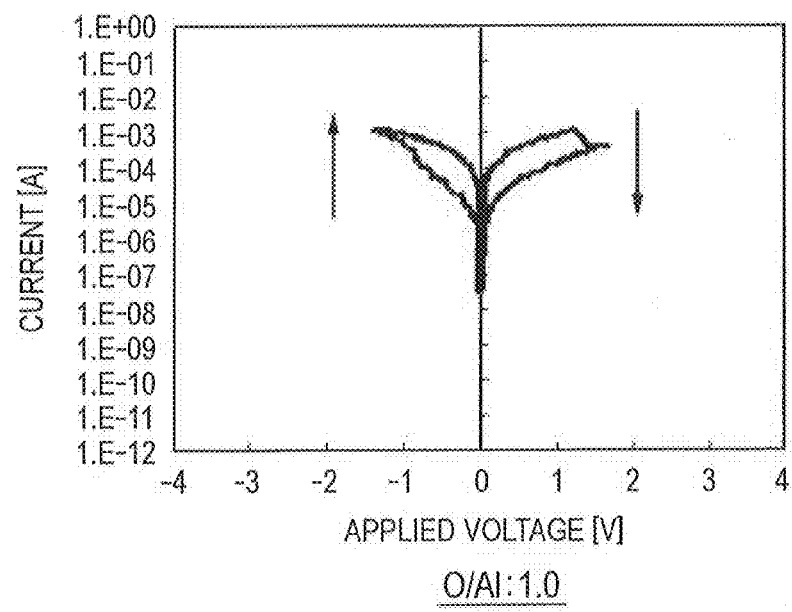
FIG. 4B is a drawing showing a current-voltage characteristic of a resistance change type nonvolatile memory element due to the composition of Al and O of the stacked type resistance change layer according to one embodiment of the present invention.
Figure 4C:
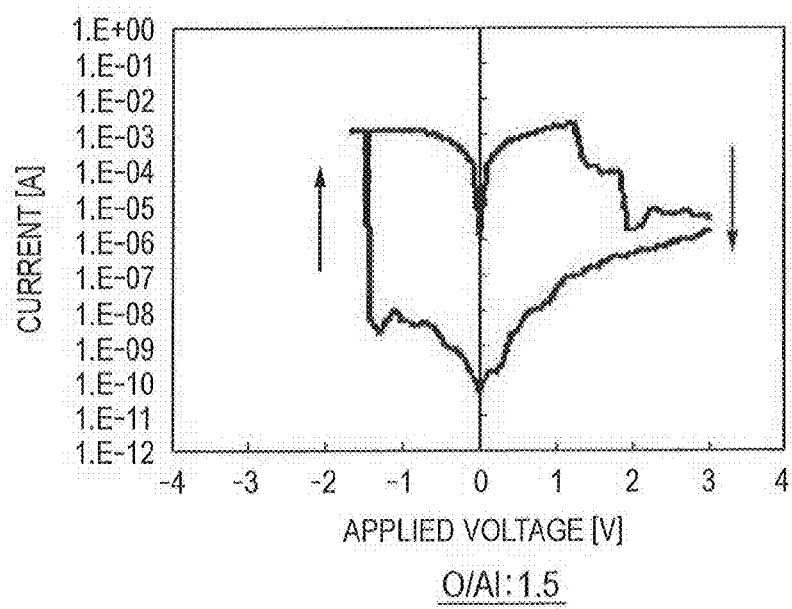
FIG. 4C is a drawing showing a current-voltage characteristic of a resistance change type nonvolatile memory element due to the composition of Al and O of the stacked type resistance change layer according to one embodiment of the present invention.
Figure 4D:
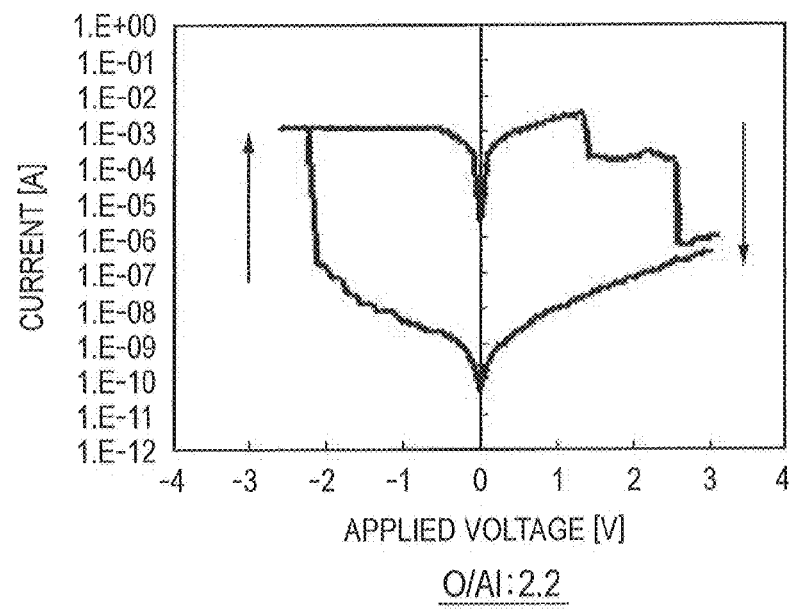
FIG. 4D is a drawing showing a current-voltage characteristic of a resistance change type nonvolatile memory element due to the composition of Al and O of the stacked type resistance change layer according to one embodiment of the present invention.

FIG. 3 is a drawing showing the relationship between the resistance change ratio of an element having an HfOx resistance change layer and the O/Hf ratio (O/Hf=0.16 to O/Hf=2.0) at a voltage 0.2 V, and, in particular, the situation, in which the resistance change ratio at set state (the resistance changes from a high resistance state to a low resistance state)/reset state (the resistance changes from a low resistance state to a high resistance state) increases from 1 digit to 6 digits along with the increase in the O/Hf ratio from 0.30 to 1.90, is known. On the other hand, a switching operation was not confirmed when the O/Hf ratio was less than 0.30 or not less than 1.90.

<Composition of O/Al and Resistance Change Characteristic>

In FIGS. 4A to 4D, there are shown current-voltage characteristics of resistance change type nonvolatile memory elements at each of the O/Al ratios (O/Al=0 to O/Al=2.2) of an AlOx layer in a stacked type resistance change layer (the O/Hf ratio is fixed to 0.30). It was confirmed that the switching operation of a bipolar type was obtained in resistance change type nonvolatile memory elements in which the O/Al ratio of the resistance change layer was from 1.0 or more. That is, it is shown that the resistance changes from a high resistance state to a low resistance state (set) when a negative voltage is applied to the resistance change type nonvolatile memory element and from a low resistance state to a high resistance state (reset) when a positive voltage is applied (hereinafter, the negative voltage applied for the set operation is referred to as "the set voltage" and the positive voltage applied for the reset operation is referred to as "the reset voltage"). From FIGS. 4A to 4D, it is known that the switching operation is not confirmed when O/Al ratio is 0 (metal Al), but that, in contrast, the switching operation is obtained in an element having an AlOx layer in which the O/Al ratio is 1.0 or more and, furthermore, in an element having an AlOx layer in which the O/Al ratio is 1.5 or more, resistance change ratio of 4 digits or more can be realized.

Meanwhile, in the description, "the resistance change ratio" denotes the ratio of resistance change at a certain voltage value. For example, in an element having an AlOx layer in which the O/Al ratio is 1.5 or more, when an applied voltage is about 2 V, a current I changes in the range of $1 \times 10^{-3}$ to $1 \times 10^{-7}$. Accordingly, from V=I×R, the resistance R can realize, in the range of $10^3$ to $1 \times 10^7$, the resistance change ratio of 4 digits.

Figure 5:
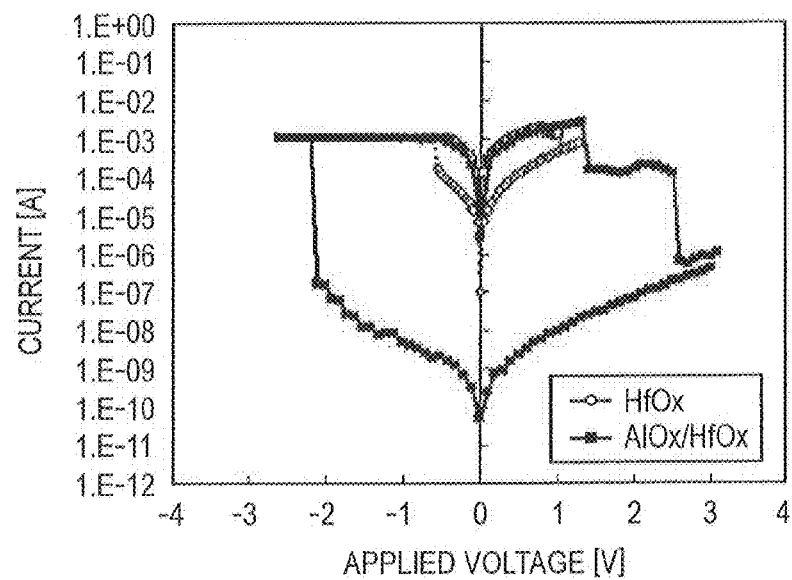
FIG. 5 is a drawing showing current-voltage characteristics of resistance change type nonvolatile memory elements of the stacked type resistance change layer according to one embodiment of the present invention, and of a conventional monolayer type resistance change layer.

FIG. 5 shows current-voltage characteristics of an element (□ in FIG. 5) in which the resistance change layer has an HfO single-layer film having the composition of an O/Hf ratio of 0.30, and of an element (■ in FIG. 5) in which the resistance change layer has of an AlO/HfO stacked film of a second metal oxide film having the composition of an O/Al ratio of 2.2 and a first metal oxide film having the composition of an O/Hf ratio of 0.30.

The resistance change ratio when an applied voltage V is 0.2 V, in the case of the HfO single layer structure, the current I changes by about 10 in the range of $1 \times 10^{-3}$ to $1 \times 10^{-4}$. Accordingly, from V=I×R, the resistance change ratios of 1 digit alone can be realized in the resistance R range of $10^3$ to $1 \times 10^4$. In contrast, the resistance change ratio when the applied voltage is 0.2 V, in the case of the AlO/HfO stacked structure, the current changes by about $10^5$ in the range of $1 \times 10^{-3}$ to $1 \times 10^{-8}$. Accordingly, from V=I×R, the resistance change ratios of 5 digits can be realized in the resistance R range of $10^3$ to $1 \times 10^8$. It was confirmed that, by setting the resistance change layer to be a stacked structure of the first metal oxide layer containing Hf and O and the second metal oxide layer containing Al and O as in one embodiment of the present invention, as compared with the case of the HfO single layer structure, the resistance change ratio was improved by approximately 4 digits.

In a resistance change layer having an HfO single layer structure, in order to obtain a resistance change ratio equivalent to that in the case of the AlO/HfO stacked structure, there is a method of increasing the O/Hf ratio. However, it is confirmed that, although the same resistance change ratio as that in the AlO/HfO stacked structure is obtained according to the method, a forming voltage (a voltage to be applied for generating initially a conduction path in an oxide film) becomes high and the set voltage and the reset voltage become high. Accordingly, it was shown that, by use of the stacked film of AlOx and HfOx in one embodiment of the present invention as the variable resistance layer, the improvement of the resistance change ratio can be realized without causing a great increase in the forming voltage.

Meanwhile, in the evaluation of rewriting resistance (endurance characteristic) of the resistance change phenomenon by applying alternately and continuously positive and negative pulses to the resistance change type nonvolatile memory element, too, an phenomenon, in which insulation breakdown occurred after the several times of application to stop the operation, was shown.

Here, the element in which the AlOx layer is inserted into the boundary of the HfOx layer and the upper TiN electrode is described, and it was also confirmed that the same effect was obtained in an element in which the AlOx layer was inserted into the boundary of the HfOx layer and the lower TiN electrode and in an element in which the AlOx layer was inserted into the boundaries of the HfOx layer and the upper TiN electrode and lower TiN electrode. That is, it is possible, by inserting the AlOx layer to at least one of the boundary of the HfOx layer and the upper TiN electrode and the boundary of the HfOx layer and the lower TiN electrode, to enhance the resistance change ratio while reducing the increase in the forming voltage.

Figure 6:
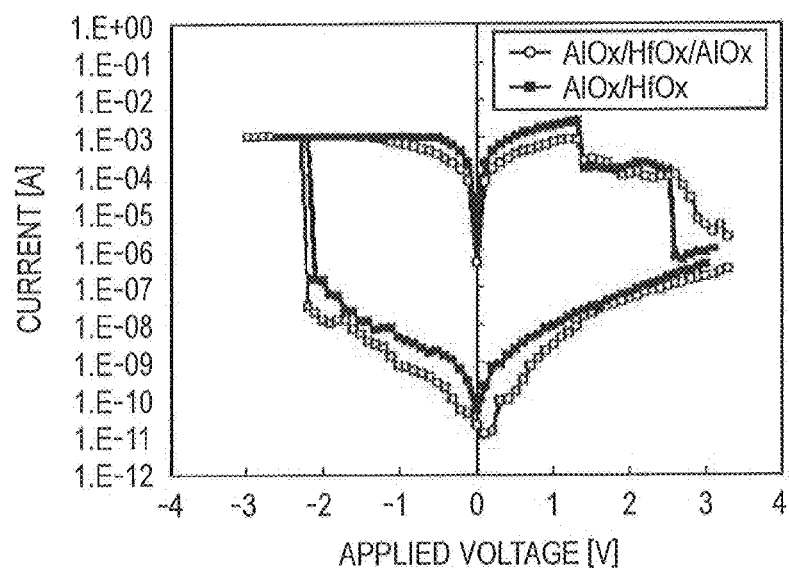
FIG. 6 is a drawing showing a current-voltage characteristic of an element in which an AlOx layer is inserted into the boundary of the HfOx layer being a resistance change layer and a lower TiN electrode, and of an element in which the AlOx layer is inserted into the boundaries of the HfOx layer and an upper TiN electrode and a lower TiN electrode, according to one embodiment of the present invention.

FIG. 6 shows the current-voltage characteristic of an element in which the AlOx layer is inserted into the boundary of the HfOx layer and the lower TiN electrode and an element in which the AlOx layer is inserted into boundaries of the HfOx layer and the upper TiN electrode and lower TiN electrode. Meanwhile, in FIG. 6, □ denotes an element in which the resistance change layer has an HfO single-layer film having the composition of an O/Hf ratio 0.30, and ■ denotes the current-voltage characteristic of an element having an AlO/HfO stacked film of a second metal oxide film having the composition of an O/Al ratio of 2.2 and a first metal oxide film having the composition of an O/Hf ratio of 0.30. As is the case for FIG. 5, it became clear that, regarding the resistance change ratio at an applied voltage 0.2 V, the resistance change ratio was improved by approximately 4 digits by setting the resistance change layer to be the stacked structure, as compared with the case of an HfO single layer structure.

<Thickness of AlO Layer and Resistance Change Characteristic>

Figure 7:
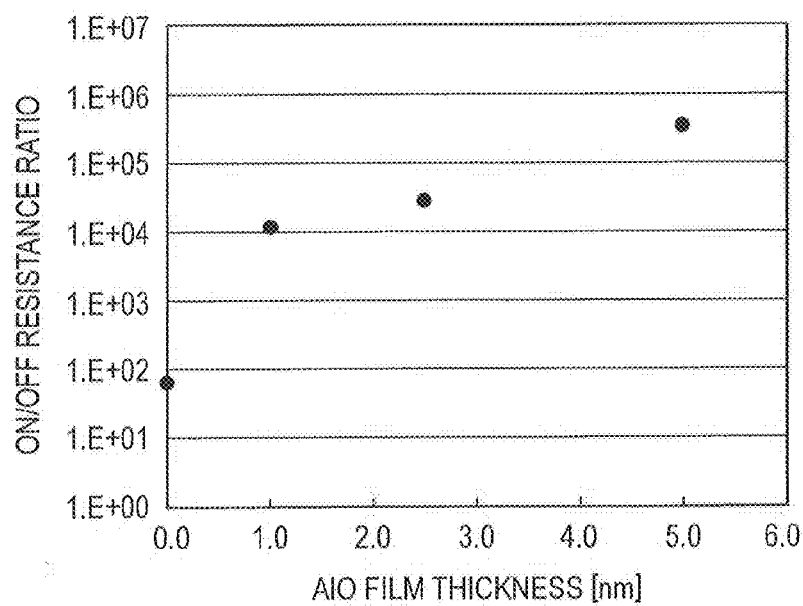
FIG. 7 is a drawing showing the relationship between the resistance change ratio and the AlOx film thickness of the resistance change type nonvolatile memory element according to one embodiment of the present invention.

FIG. 7 is a drawing showing the relationship between the resistance change ratio of the element and the AlO film thickness as the second metal oxide film at a voltage of 0.2 V, in which case the HfO film thickness as the first metal oxide film was fixed to 20 nm. It is shown that the resistance change ratio at set/reset from the AlO film thickness of 1 nm or more is $1 \times 10^4$ in the case where the AlO film thickness is 1 nm and $1 \times 10^6$ in the case where the AlO film thickness is 5 nm. Consequently, the situation that the resistance change ratio at set/reset increases from 4 digits to 6 digits is known.

From the above results, by use of the resistance change layer (a variable resistance layer) having the stacked film of the first metal oxide film containing Hf and O and the second metal oxide containing Al and O in one embodiment of the present invention, it is possible to increase the resistance change ratio without increasing greatly the forming voltage. In the element having the above-mentioned resistance change layer, it is preferable that the molar ratio of Al and O of the second metal oxide film for obtaining the resistance change operation is 1.0 to 2.2, and is more preferable that, for realizing the resistance change ratio of 4 digits or more, the ratio is 1.5 to 2.2. It is preferable that the film thickness is 1 nm or more. In addition, it is preferable that the molar ratio of Hf and O of the first metal oxide film is 0.30 to 1.90.

In the above description, although it was described that the molar ratios of Hf and O, and Al and O in the variable resistance layer were adjusted by the mixing ratio of argon and oxygen introduced in the sputtering, it is not limited to this, and for example, a method, in which the molar ratios of Hf and O, and Al and O are adjusted by a heat treatment in an oxygen atmosphere after continuous formation of an Hf metal film and an Al metal film as the variable resistance layer, may also be used. In addition, from the viewpoint of suppressing the oxidation of the electrode layer, it is desirable that the heat treatment temperature in an oxygen atmosphere is in the range of 300° C. to 600° C.

<Composition/Crystallinity of Titanium Nitride Film and Resistance Change Characteristic>

Next, in the case where the optimum titanium nitride film is used as electrodes holding the stacked type resistance change layer obtained by stacking the first metal oxide containing Hf and O and the second metal oxide containing Al and O according to one embodiment of the present invention interposed therebetween, the structure (composition/crystallinity) of the titanium nitride film for obtaining the resistance change operation is described.

Figure 8:
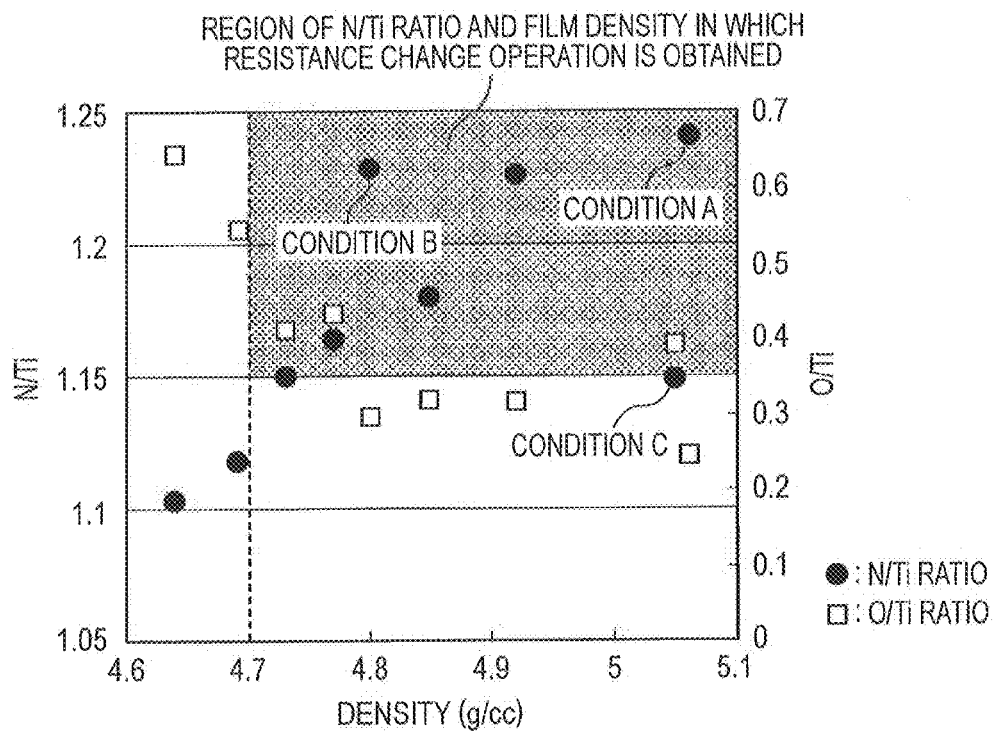
FIG. 8 is a drawing showing the relationship between the film composition (an N/Ti ratio: corresponding to ● in the drawing) and the film composition (an O/Ti ratio: corresponding to □ in the drawing), and the film density of the titanium nitride film according to one embodiment of the present invention.

FIG. 8 shows the relationship between the film composition (the N/Ti ratio: corresponding to ● in the drawing) and the film composition (the O/Ti ratio: corresponding to □ in the drawing), and the film density of the titanium nitride film in one embodiment of the present invention. As the result of evaluating the switching characteristic of the resistance change type nonvolatile memory element fabricated in the embodiment, it was confirmed that the switching operation due to the resistance change was obtained in the region where the film density shown in the drawing is 4.7 g/cc or more and the film composition N/Ti ratio is 1.15 or more. On the other hand, in the region where the film density is smaller than 4.7 g/cc and the film composition O/Ti ratio is smaller than 1.15, the switching operation due to the resistance change was not obtained. It is considered that this results from the increase in the film composition O/Ti ratio in the region shown in the drawing in which the film composition O/Ti ratio is smaller than the film density 4.7 g/cc and the film composition N/Ti ratio is smaller than the film density 4.7 g/cc. That is, this suggests that, when the film composition O/Ti ratio increases and the oxygen in the variable resistance change layer moves to some extent into the titanium nitride film, the resistance change due to the voltage application does not occur.

Figure 9:
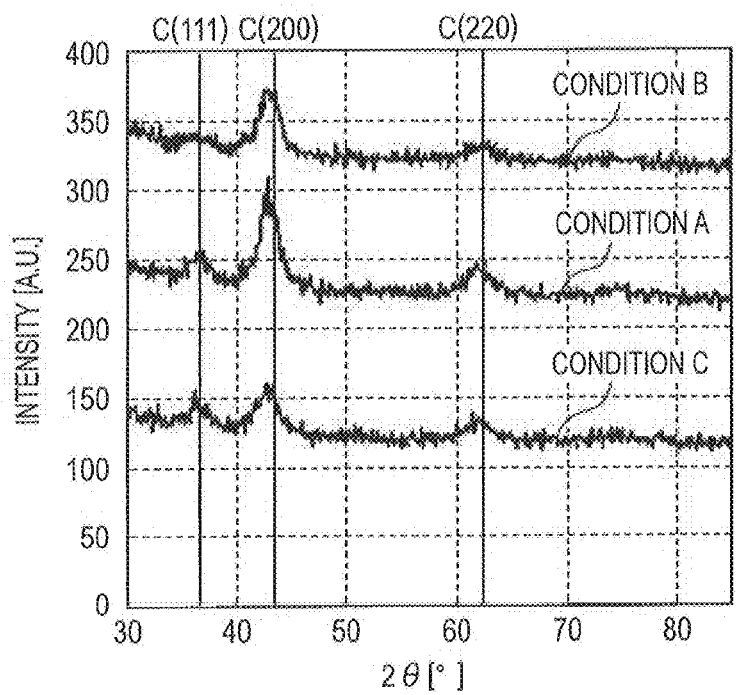
FIG. 9 is a drawing showing the relationship between the peak intensity ratio in an XRD diffraction spectrum of the titanium nitride film and the film composition according to one embodiment of the present invention.

Next, XRD (X-ray Diffraction) spectra of deposited titanium nitride films under the condition A (argon gas flow rate 10 sccm, nitrogen gas flow rate 10 sccm), the condition B (argon gas flow rate 0 SCCM, nitrogen gas flow rate 50 SCCM) and the condition C (argon gas flow rate 13.5 sccm, nitrogen gas flow rate 6 sccm) shown in FIG. 8 are shown in FIG. 9. 2θ on the abscissa in FIG. 9 is an angle when making X-rays enter at the angle of θ relative to the horizontal direction of a sample and detecting X-rays of an angle 2θ relative to the incident X-rays among X-rays that come out, reflected from the sample, and the intensity on the ordinate denotes the intensity (arbitrary value) of X-rays of the sample by which the diffraction occurred. C(111), C(200) and C(220) in FIG. 9 each represent the crystalline plane of the titanium nitride film, (111) plane, (200) plane and (220) plane. As shown in the drawing, the titanium nitride film in one embodiment of the present invention by which the resistance change operation is obtained has a crystalline structure in which the crystal orientation of the (200) plane is high.

Figures 10, 11:
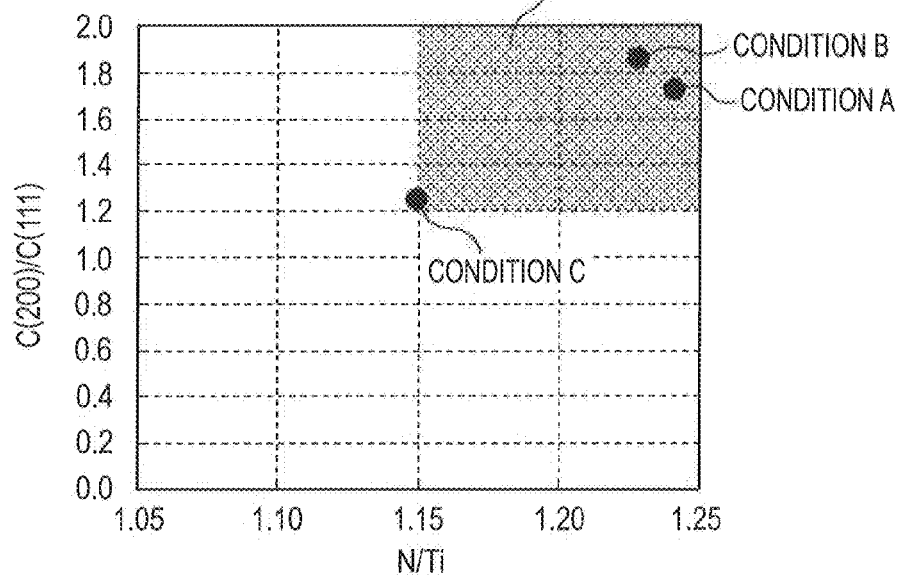
FIG. 10 is a drawing showing the relationship between the peak intensity ratio in an XRD diffraction spectrum and the film composition of the titanium nitride film according to one embodiment of the present invention.
FIG. 11 is a drawing showing an observed image of the titanium nitride film according to one embodiment of the present invention with an SEM.

FIG. 10 shows the relationship between the film composition (the N/Ti ratio) of the titanium nitride film in the present invention and a peak intensity ratio C(200)/C(111) of the (111) plane and the (200) plane in the XRD spectrum shown in FIG. 9. As shown in FIG. 10, in the titanium nitride film in which the film composition N/Ti ratio is 1.15 or more by which the resistance change operation in the present invention is obtained, the peak intensity ratio has 1.2 or more. Here, the morphology of a titanium nitride film with a high peak intensity ratio was evaluated by the observation of the cross-section and surface with an SEM. FIG. 11 shows an observed image of the titanium nitride film deposited under the condition A with an SEM (a scanning electron microscope). As shown in the drawing, it can be confirmed that the titanium nitride film in the present invention has a columnar structure of a grain size of 20 nm or less and is excellent in surface flatness. It is considered that, due to a small grain size and excellence in surface flatness, a leak current caused by a crystal grain boundary is suppressed and a high resistance change ratio necessary for the resistance change type nonvolatile memory element is obtained. In addition, it is considered that to have a small grain size and dense crystal structure leads to the improvement of the film density.

From the above-mentioned results, in the titanium nitride film suitable for the element having a variable resistance layer including a stacked type resistance change layer being the stacked body of the first metal oxide containing Hf and O and the second metal oxide containing Al and O in one embodiment of the present invention, it is preferable that the molar ratio of Ti and N of 1.15 or more, and is furthermore preferable that the film density is 4.7 g/cc or more. In addition, it is preferable that a peak intensity ratio X of C[220]/C[111] in the XRD spectrum representing the crystal orientation of the metal nitride layer is 1.2 or more. Here, in the present invention, "the crystal orientation" denotes the ratio of (200) peak intensity and (111) peak intensity (C(200)/C(111)) in the X-ray diffraction spectrum of a metal nitride layer containing Ti and N.

The deposition process of the titanium nitride film in one embodiment of the present invention is a process of magnetron-sputtering a Ti target under a mixed atmosphere of a reactive gas containing nitrogen and an inert gas, in a vacuum vessel in which the target is placed in an obliquely upper offset position relative to a substrate as shown in FIG. 2, in order to suppress the deterioration of element characteristics due to plasma damage to a variable resistance layer, and to control the composition and crystal orientation. In the process, it is preferable to set the mixing ratio of the nitrogen gas and the inert gas so that the molar ratio of Ti and N in the metal nitride layer is 1.15 or more and crystal orientation X1 satisfies the range of 1.2<X.

<Manufacturing Apparatus of Resistance Change Type Nonvolatile Memory Element>

From the above-mentioned description, in order to obtain a resistive operation in the element having the stacked type resistance change layer of the first metal oxide containing Hf and O and the second metal oxide containing Al and O in one embodiment of the present invention, it is necessary to control the composition of Hf and O and the composition of Al and O. In addition, it is desirable to suppress the oxidation of the boundary of the resistance change layer and electrodes (the first electrode and second electrode) holding the resistance change layer interposed therebetween. Accordingly, in order to fabricate the resistance change type nonvolatile memory element in one embodiment of the present invention, it is desirable to form, after forming the first electrode on a substrate to be processed, the variable resistance layer without exposing the substrate to be processed to the air and, after that, to form the second electrode without exposing the substrate to be processed to the air.

Meanwhile, the formation of the first electrode, the variable resistance layer and the second electrode may be processed in the same processing apparatus, but, in order to prevent or reduce mutual contamination of the metal element configuring the electrode layer and the element configuring the variable resistance layer, it is desirable to perform the processing by use of a manufacturing apparatus including a processing apparatus for forming the electrode and a processing apparatus for forming the variable resistance layer connected to a conveying device preventing the air exposure of the substrate to be processed. In addition, as a formation process of the variable resistance layer, when performing a heat treatment in an oxygen atmosphere after depositing continuously metal films of Hf and Al, it is desirable to perform the processing by use of a manufacturing apparatus including a processing apparatus for forming the electrode, a processing apparatus depositing a metal film and a processing apparatus performing a heat treatment in an oxygen atmosphere connected to a conveying device preventing the air exposure of the substrate to be processed. In addition, when a thin film diode layer in which a metal film, silicon etc. are formed is exposed on the surface as the substrate to be processed, for the purpose of reducing contact resistance, a processing of removing the oxide film on the metal film and silicon surface becomes necessary. On this occasion, a pretreatment apparatus may be connected to the above-mentioned manufacturing apparatus.

Figure 12:
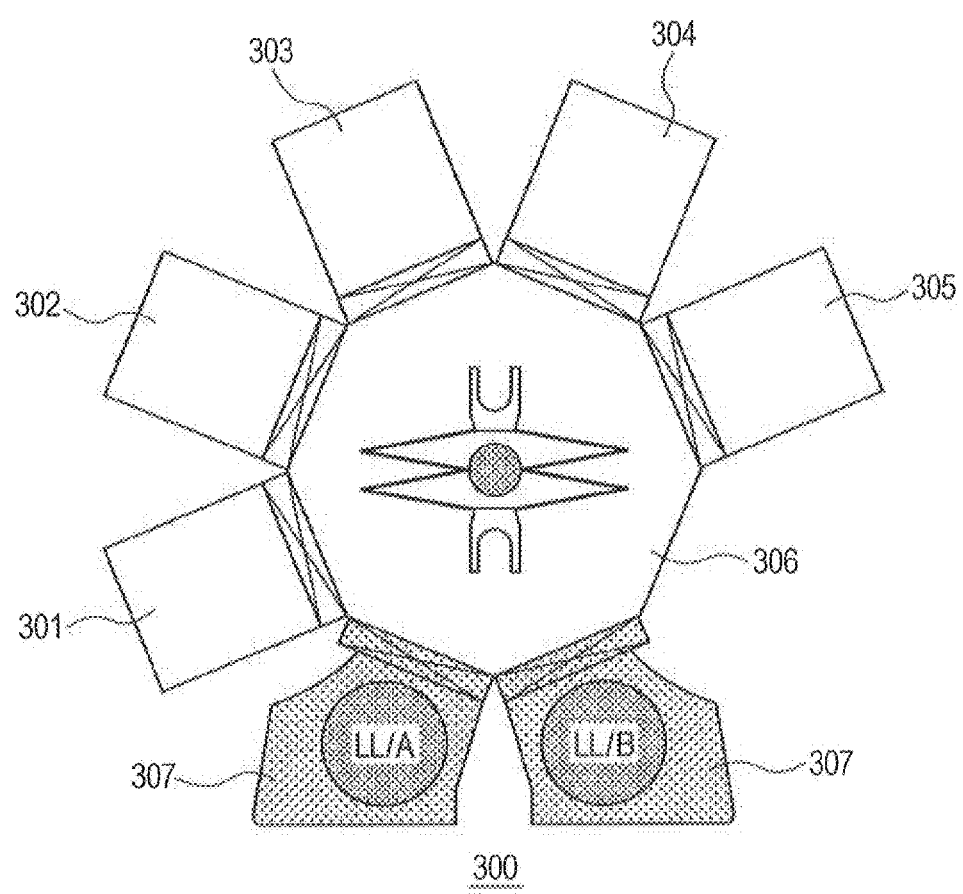
FIG. 12 is a drawing showing a plan view of a manufacturing apparatus of the element according to one embodiment of the present invention.

In FIG. 12, the best mode manufacturing apparatus 300 of the resistance change type nonvolatile memory element for use in implementing one embodiment of the present invention is shown. The manufacturing apparatus 300 is an apparatus capable of implementing the following 1 to 6 processes without exposing the substrate to be processed to the air. A first process is a process of conveying a substrate 11, which is carried in from a load lock chamber 307 to a convey chamber 306, to a pretreatment/pre-etch chamber 301 and implementing a pretreatment, and a second process is a process of conveying the substrate 11, when the pretreatment terminates, from the pretreatment/pre-etch chamber 301 to a first electrode (lower electrode) formation chamber 302 and forming a titanium nitride film 12 based on film formation conditions. A third process is a process of conveying, when deposition processing of a foundation terminates, the substrate 11 in the first electrode (lower electrode) formation chamber 302 to a variable resistance layer formation chamber 303 and forming a first variable resistance layer 13, and a fourth process is a process of conveying, when the deposition processing of the first variable resistance layer 13 terminates, the substrate 11 in the first variable resistance layer formation chamber 303 to a second variable resistance layer formation chamber 304, and forming a second variable resistance layer 14. A fifth process is a process of conveying, when the deposition processing of the second variable resistance layer 14 terminates, the substrate 11 in the second variable resistance layer formation chamber 304 to a second electrode (upper electrode) formation chamber 305, and forming a titanium nitride film 15 based on film formation conditions, and a six process is a process of conveying, when the variable resistance element has been formed, the substrate 11 in the second electrode (upper electrode) formation chamber 305 to a load lock chamber 307, and carrying out the substrate 11.

Figure 13:
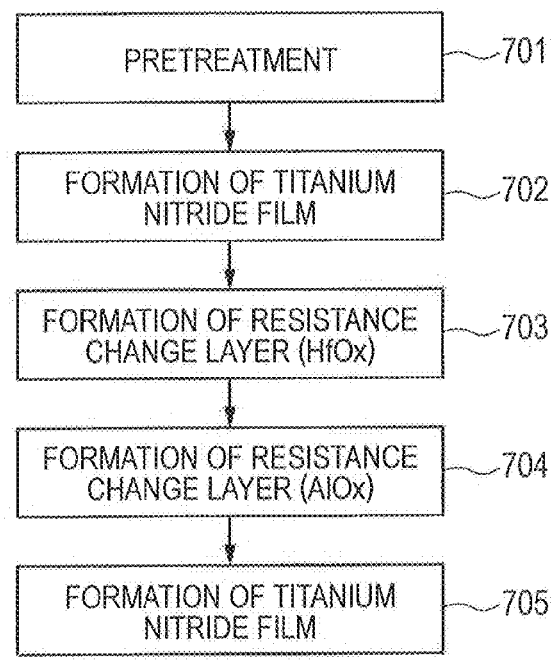
FIG. 13 is a drawing showing a process flow of a variable resistance element of the element according to one embodiment of the present invention.

FIG. 13 is a drawing showing a process flow of fabricating the variable resistance element according to one embodiment of the present invention by use of the manufacturing apparatus 300 shown in FIG. 12. Step 701 is a pretreatment step, in which degasification may be implemented, or may be a process of removing a surface oxidation film. After the pretreatment, on the substrate, a titanium nitride film is formed as the first electrode (Step 702). After that, without exposing the substrate to the air, a variable resistance layer (a resistance change layer HfOx) is formed (Step 703), and furthermore, a variable resistance layer (a resistance change layer AlOx) is formed (Step 704), and next, the titanium nitride film of the second electrode is formed by the same method as that for the first electrode (Step 705).

EXAMPLE 1

Figure 14:
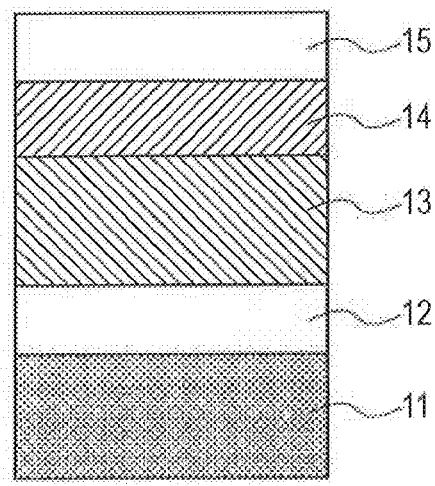
FIG. 14 is a drawing showing a cross-sectional structure of the element according to one embodiment of the present invention.

FIG. 14 is an outline of the cross section of the element structure according to the example 1. For a silicon substrate 11 having a silicon oxide film of a thickness of 100 nm on the surface as a substrate to be processed, the formation of an electrode layer and a variable resistance layer was performed by use of the manufacturing apparatus 300 shown in FIG. 12.

In a lower electrode processing chamber 302 belonging to the manufacturing apparatus 300, a titanium nitride film 12 having a molar ratio of Ti and N of 1.15 or more and a crystal orientation X1 in the range of 1.2<X was deposited in 10 nm by use of a Ti metal target under an argon gas flow rate of 0 sccm and a nitrogen gas flow rate of 50 sccm.

Next, in the variable resistance layer formation chamber 303 belonging to the manufacturing apparatus 300, a variable resistance layer HfOx 13 having a molar ratio of O and Hf of 1.30 to 1.90 was deposited in 20 nm by use of an Hf metal target under an argon gas flow rate of 20 sccm and an oxygen gas flow rate of 10 sccm.

Next, on the variable resistance layer HfOx 13, a variable resistance layer AlOx 14 having a molar ratio of O and Al of 1.0 to 2.2 was deposited in 2.5 nm by use of a variable resistance layer formation chamber 304 belonging to the manufacturing apparatus 300 and by use of an Al metal target under an argon gas flow rate of 20 sccm and an oxygen gas flow rate of 40 sccm.

Next, on the variable resistance layer AlOx 14, a titanium nitride film 15 was deposited by use of an upper electrode processing chamber 305 belonging to the manufacturing apparatus 300 in the same manner as that in the titanium nitride film 12.

Next, by use of a lithographic technology and an RIE (Reactive Ion Etching) technology, the TiN film was processed into a desired size to form an element.

Compositions of the deposited HfOx film and AlOx were analyzed by an X-ray photoelectron spectroscopy (XPS) method. The resistance change operation of the fabricated element was evaluated by a current-voltage measurement.

Figure 15:
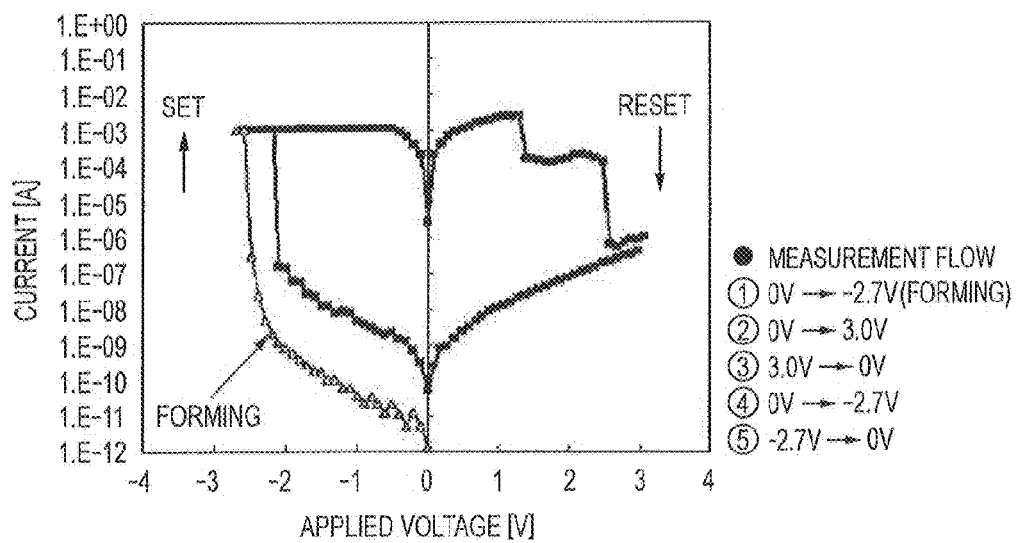
FIG. 15 is a drawing showing a current-voltage characteristic of the element according to one embodiment of the present invention.
Figure 16:
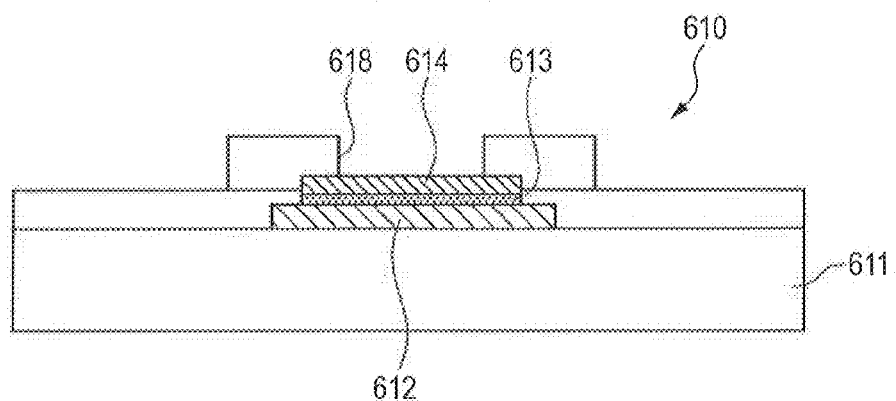
FIG. 16 is an outline view showing a cross-sectional structure of a conventional resistance change type nonvolatile memory element.

In FIG. 15, the current-voltage characteristic of the fabricated resistance change type nonvolatile memory element is shown. Regarding the current-voltage characteristic, a forming operation of grounding the titanium nitride film 12 of the element and applying a voltage of 0 V→−2.7 V to the titanium nitride film 15 to generate a conduction path in the oxide film was implemented. After that, each of voltages of 0 V→3.0 V, 3.0 V→0 V, 0 V→−2.7 V and −2.7 V→0 V was applied and measurements were performed. As shown in the drawing, when applying voltages in the range of 0 V→−2.7 V to the titanium nitride film 15, the increase in the current value due to the change from a high resistance state to a low resistance state (a set operation) can be confirmed at V=−2.1 V. Next, when applying voltages in the range of 0 V→3.0 V to the titanium nitride film 15, the decrease in the current value due to the change from a low resistance state to a high resistance state (a reset operation) can be confirmed at V=2.6 V. As described above, it is shown that, in the resistance change type nonvolatile memory element having the stacked structure of the HfOx film 13 and the AlOx 14 film according to one embodiment of the present invention, a resistance change type nonvolatile memory element in which the On/Off resistance change ratio in a low resistance state and a high resistance state has a value of $10^3$ or more can be formed.

In the above example, as a method for forming the variable resistance layer, the case where the deposition was performed by a reactive sputtering method for an Hf metal target using a mixed gas of a reactive gas containing oxygen and an inert gas and reactive sputtering for an Al metal target using a mixed gas of a reactive gas containing oxygen and an inert gas was described. However, it was confirmed that the same effect as that in the example was also obtained using a method as a formation process of the variable resistance layer, in which an Hf metal film was deposited in the chamber 303 and, next, an Al metal film was deposited in the chamber 304, and then an annealing treatment at 300° C. to 600° C. was implemented in an oxygen atmosphere.

In addition, in the above-mentioned example, the case where the silicon substrate having a silicon oxide film of thickness of 100 nm on the surface was used as the substrate to be processed. However, it was confirmed that the same effect as that in the example was also obtained by using a substrate in which W was exposed in a part of the substrate surface as the substrate to be processed and, after removing the surface oxide of W in the pretreatment chamber 301, forming the electrode layer and the variable resistance layer in the manufacturing apparatus 300.

The invention claimed is:

1. A method of manufacturing a nonvolatile memory element including:
    a first electrode;
    a second electrode; and
    a variable resistance layer that is interposed between the first electrode and the second electrode and in which a resistance value thereof changes into at least two different resistance states,
    wherein the variable resistance layer possesses a stacked structure having a first metal oxide layer containing Hf and O, and a second metal oxide layer that is provided between the first metal oxide layer and at least one of the first electrode and the second electrode and contains Al and O,
    wherein a step of forming the variable resistance layer includes:
        forming the first metal oxide layer; and
        forming the second metal oxide layer,
    wherein the forming of the first metal oxide layer has a first magnetron sputtering step, under a mixed atmosphere of a reactive gas containing oxygen and an inert gas, of using hafnium as a metal target and setting a mixing ratio of the reactive gas and the inert gas so that a molar ratio of O to Hf satisfies a range of 0.30 to 1.90,
    wherein the forming of the second metal oxide layer has a second magnetron sputtering step, under a mixed atmosphere of a reactive gas containing oxygen and an inert gas, of using aluminum as a metal target and setting a mixing ratio of the reactive gas and the inert gas so that a molar ratio of O to Al satisfies a range of 1.0 to 2.2,
    wherein the first electrode and the second electrode are made of a titanium nitride film,
    wherein each of a step of forming the first electrode and a step of forming the second electrode is a step of subjecting a Ti target to magnetron sputtering under a mixed atmosphere of a reactive gas containing nitrogen and an inert gas, and
    wherein in each of the step of forming the first electrode and the step of forming the second electrode, a mixing ratio of the nitrogen gas and the inert gas is set so that a molar ratio of Ti and N in the titanium nitride film is 1.15 or more, and that crystal orientation X being a ratio of (200) peak intensity to (111) peak intensity in an X-ray diffraction spectrum of the titanium nitride film satisfies the range of 1.2<X.

2. The method of manufacturing a nonvolatile memory element according to claim 1,
    wherein in the forming of the first metal oxide layer, a supply rate of a reactive gas containing oxygen supplied into a vacuum vessel, in which the forming of the first metal oxide layer is performed, is set to be not more than a supply rate that provides a maximum decreasing rate of a sputtering rate generated by the oxidation of a surface of a hafnium metal target, and
    wherein in the forming of the second metal oxide layer, a supply rate of a reactive gas containing oxygen supplied into a vacuum vessel, in which the forming of the second metal oxide layer is performed, is set to be not more than a supply rate that provides a maximum decreasing rate of a sputtering rate generated by the oxidation of a surface of an aluminum metal target.

3. The method of manufacturing a nonvolatile memory element according to claim 1, further comprising:
    the step of forming the first electrode before the step of forming the variable resistance layer; and
    the step of forming the second electrode after the step of forming the variable resistance layer,
    wherein the step of forming the first electrode, the step of forming the variable resistance layer, and the step of forming the second electrode are performed without exposure of a substrate to be processed to the air.

4. The method of manufacturing a nonvolatile memory element according to claim 1, wherein the at least two different resistance states are a reset state that changes from a low resistance to a high resistance, and a set state that changes from a high resistance to a low resistance.

* * * * *